(12) United States Patent
Koller et al.

(10) Patent No.: US 8,323,996 B2
(45) Date of Patent: Dec. 4, 2012

(54) SEMICONDUCTOR DEVICE

(75) Inventors: Adolf Koller, Regensburg (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 89 days.

(21) Appl. No.: 12/396,123

(22) Filed: Mar. 2, 2009

(65) Prior Publication Data

US 2010/0221854 A1 Sep. 2, 2010

(51) Int. Cl.
*H01L 21/50* (2006.01)
*H01L 33/00* (2010.01)

(52) U.S. Cl. .................. 438/26; 438/459; 257/E21.499; 257/E33.056

(58) Field of Classification Search .................... 438/24, 438/26, 55, 63, 64, 192, 212, 268, 459, 29, 438/33, 119, 455, 458, 456; 257/E21.499, 257/E33.056, E33.068
See application file for complete search history.

(56) References Cited

U.S. PATENT DOCUMENTS

| 4,794,445 | A | | 12/1988 | Homma et al. | |
|---|---|---|---|---|---|
| 5,569,620 | A | | 10/1996 | Linn | |
| 6,124,179 | A | * | 9/2000 | Adamic, Jr. | 438/309 |
| 6,316,287 | B1 | * | 11/2001 | Zandman et al. | 438/113 |
| 6,392,290 | B1 | * | 5/2002 | Kasem et al. | 257/678 |
| 6,455,398 | B1 | | 9/2002 | Fonstad et al. | |
| 7,488,621 | B2 | * | 2/2009 | Epler et al. | 438/113 |
| 2001/0033001 | A1 | | 10/2001 | Kato | |
| 2008/0096365 | A1 | | 4/2008 | Chitnis | |
| 2009/0121241 | A1 | * | 5/2009 | Keller et al. | 257/96 |
| 2010/0193809 | A1 | * | 8/2010 | Tsai et al. | 257/98 |

FOREIGN PATENT DOCUMENTS

| EP | 02 56 397 | 2/1988 |
|---|---|---|
| WO | 01 06546 | 1/2001 |

* cited by examiner

*Primary Examiner* — Julio J Maldonado
*Assistant Examiner* — Daniel Shook
(74) *Attorney, Agent, or Firm* — Dicke, Billig & Czaja, PLLC

(57) ABSTRACT

A method of manufacturing a semiconductor device includes attaching a first semiconductor substrate to a support substrate, and thinning the first semiconductor substrate to form a thinned semiconductor layer. The method additionally includes integrating a functional element with the thinned semiconductor layer, and forming at least one through-connect through the thinned semiconductor layer.

24 Claims, 6 Drawing Sheets

SEMICONDUCTOR DEVICE

BACKGROUND

Market demand for smaller and more functional electronic devices has driven the development of semiconductor components, including semiconductor packages, and entire systems disposed on a semiconductor chip. The space available inside the electronic devices is limited, particularly as the electronic devices are made smaller.

Some electronic devices, such as cellular telephones, employ a variety of design-specific semiconductor chips, and it is desirable to minimize the size of these semiconductor chips. Other electronic devices include power transistors and diodes that are employed in the automotive industry and are exposed to demanding temperature and vibration environments. It is desirable to provide power semiconductor devices with thin chips having improved heat dissipation.

Thin semiconductor chips are useful in a wide range of applications, but the difficulty in handling such thin devices remains an unsolved challenge.

For these and other reasons there is a need for the present invention.

SUMMARY

One aspect provides a method of manufacturing a semiconductor device. The method includes attaching a first semiconductor substrate to a support substrate, and thinning the first semiconductor substrate to form a thinned semiconductor layer. The method additionally includes integrating a functional element with the thinned semiconductor layer, and forming at least one through-connect through the thinned semiconductor layer.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
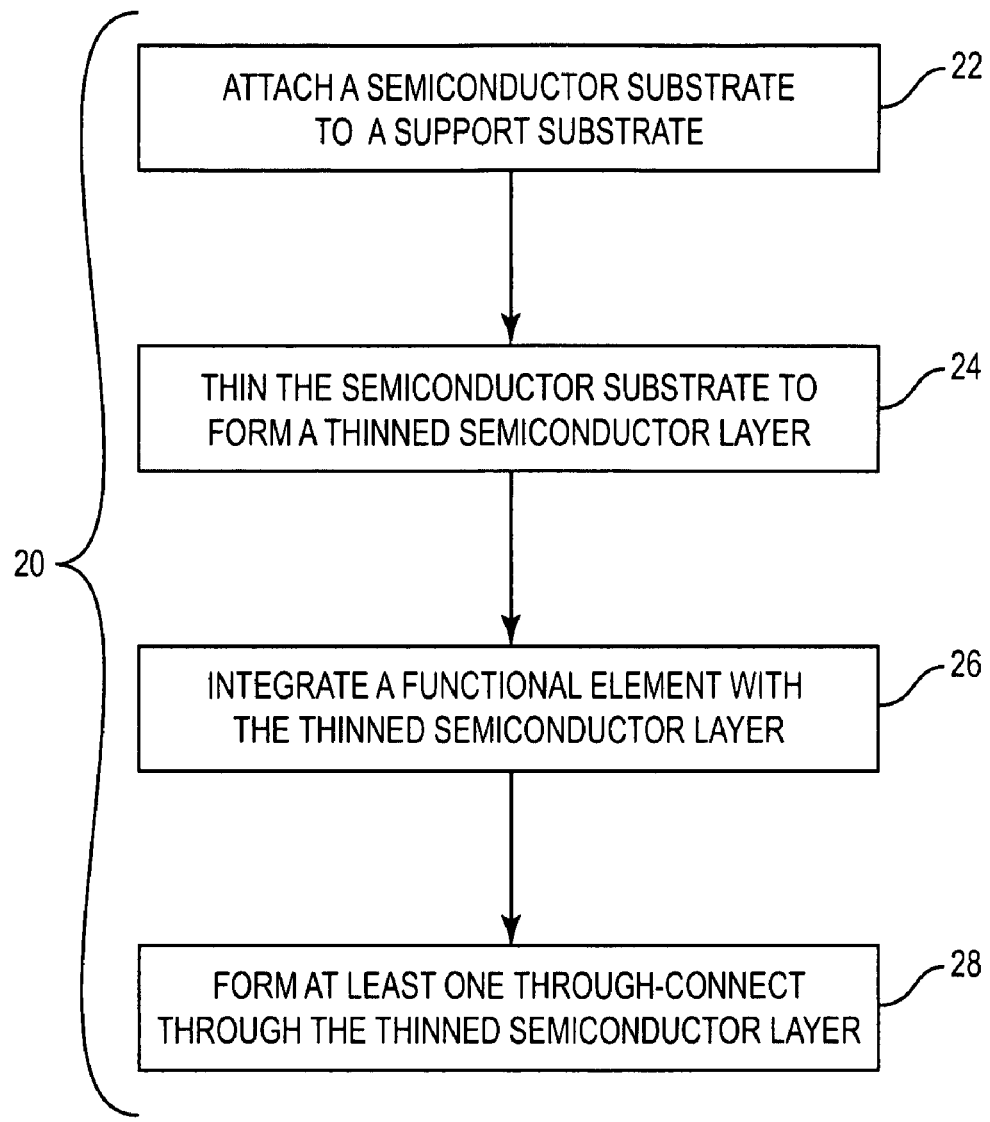
FIG. 1 is a block diagram of a process for manufacturing a semiconductor device according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In addition, while a particular feature or aspect of one embodiment may be disclosed with respect to only one of several implementations, such feature or aspect may be combined with one or more other features or aspects of the other implementations as may be desired and advantageous for any given or particular application. Furthermore, to the extent that the terms "include," "have," "with," or other variants thereof are used in either the detailed description or the claims, such terms are intended to be inclusive in a manner similar to the term "comprise." The terms "coupled" and "connected," along with derivatives may be used. It should be understood that these terms may be used to indicate that two elements cooperate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a method of fabricating a semiconductor device may use various types of semiconductor chips or semiconductor substrates, among them logic integrated circuits, analog integrated circuits, mixed signal integrated circuits, sensor circuits, MEMS (Micro-Electro-Mechanical Systems), power integrated circuits, chips with integrated passives, discrete passives and so on. In general the term "semiconductor chip" as used in this application can have different meanings one of which is a semiconductor die or semiconductor substrate including an electrical circuit.

In several embodiments layers are applied to one another or materials are applied or deposited onto layers. It should be appreciated that any such terms as "applied" or "deposited" are meant to cover literally all kinds and techniques of applying layer onto each other. In one embodiment, they are meant to cover techniques in which layers are applied at once as a whole, like, for example, laminating techniques, as well as techniques in which layers are deposited in a sequential manner, like, for example, sputtering, plating, molding, chemical vapor deposition (CVD) and so on. One example for a layer to be applied is the redistribution layer (RDL). The redistribution layer can be in the form of a multilayer, in particular a multilayer including a repeating layer sequence.

The semiconductor chips may include contact elements or contact pads on one or more of their outer surfaces wherein the contact elements serve for electrically contacting the semiconductor chips. The contact elements may be made from any electrically conducting material, e.g., from a metal as aluminum, gold, or copper, for example, or a metal alloy, e.g., solder alloy, or an electrically conducting organic material, or an electrically conducting semiconductor material.

In some embodiments the semiconductor chips are covered with an encapsulant material. The encapsulant material includes any electrically insulating material like, for example, any kind of molding material, any kind of epoxy material, or any kind of resin material with or without any kind of filler materials. In special cases it could be advantageous to use a conductive encapsulant material. In the process of covering the semiconductor chips or dies with the encapsulant material, a fan-out of embedded dies is fabricated. The fan-out of embedded dies is arranged in an array having the form of a wafer and is referred to as a "re-configured wafer." However, it should be appreciated that the fan-out of embedded dies is not limited to the form and shape of a wafer but can have any size and shape and any suitable array of semiconductor chips embedded therein.

In the claims and in the following description different embodiments of a method of fabricating a semiconductor device are described as a particular sequence of processes or measures, in particular in the flow diagrams. It is to be noted that the embodiments should not be limited to the particular sequence described. Particular ones or all of different processes or measures can also be conducted simultaneously or in any other useful and appropriate sequence.

Embodiments provide a method of manufacturing a semiconductor chip that includes an ultra thin semiconductor layer that is easy to handle, and can be directly manufactured to include a functional heat sink. A support substrate is employed to provide support to the ultra thin semiconductor layer to enable efficient manufacturing and processing of commercially available ultra thin semiconductor chips. The ultra thin semiconductor layer enables the formation of through-connections in a direct and simple manner since the ultra thin easily accommodates drilling, or boring, or etching to form the through-connection.

Embodiments provide a thinned semiconductor layer having a very thin Z-direction configured for high heat dissipation and excellent vertical current flow. In one embodiment, the support substrate is configured as a heat sink configured to evacuate heat away from a functional chip integrated into the thinned semiconductor layer. Embodiments provide simple realization of plated through-holes in the semiconductor layer since the thin Z-direction thickness is easily though-connected.

FIG. 1 is a block diagram of a process 20 for manufacturing a semiconductor device according to one embodiment. Process 20 includes attaching a semiconductor substrate to a support substrate at 22. At 24, the semiconductor substrate is thinned to form a thin semiconductor layer. At 26, a functional element is integrated with the thinned semiconductor layer. At 28, at least one through-connect is formed through the thinned semiconductor layer. In one embodiment, thin semiconductor layer is provided as an ultra thin layer.

In this specification, ultra thin means a layer having a thickness that is less than seventy micrometers, preferably less than fifty micrometers, and more preferably less than about twenty-five micrometers. In one embodiment, an ultra thin semiconductor layer is provided having a thickness between about 5-50 micrometers.

Embodiments and realizations of providing a commercially available semiconductor chip including an ultra thin semiconductor layer are better understood with reference to the following drawings.

Figure 2A:
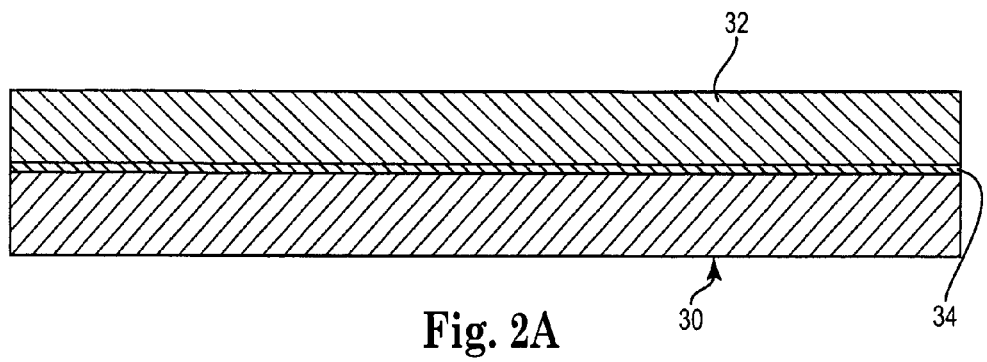
FIGS. 2A-2C are schematic cross-sectional views of the process illustrated in FIG. 1 according to one embodiment.
Figure 2B:
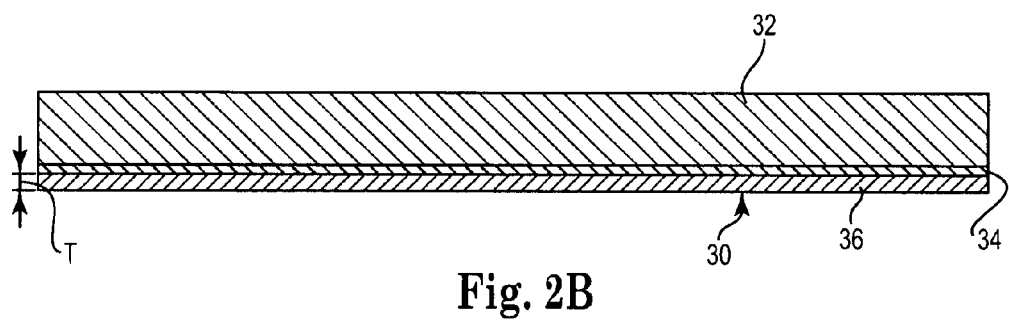
Figure 2C:
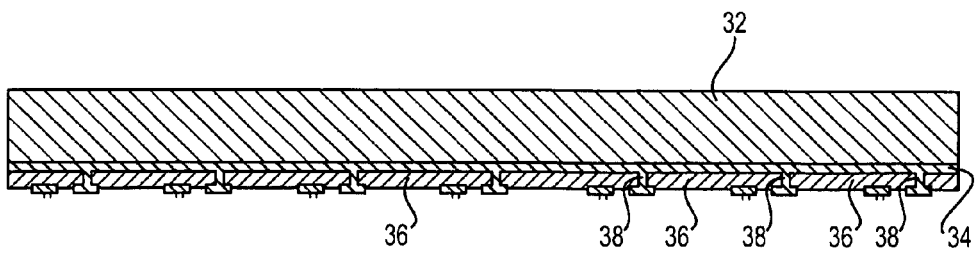

FIGS. 2A-2C are schematic cross-sectional views of a semiconductor device fabricated according to process 20 as illustrated in FIG. 1.

FIG. 2A is a schematic cross-sectional view of a semiconductor substrate 30 attached to a support substrate 32 across an interface 34. In one embodiment, semiconductor substrate 30 is provided as a semiconductor wafer having a wafer thickness of between 250-750 micrometers. For example, semiconductor substrate 30 is in one embodiment provided as a 300 mm diameter wafer of chips and is attached to a suitably sized support substrate 32.

In one embodiment, support substrate 32 is provided as a semiconductor substrate having a thickness of between about 250-750 micrometers and configured to support semiconductor substrate 30 in subsequent processing steps. In one embodiment, support substrate 32 is provided as a metal layer having a thickness of between about 250-750 micrometers and configured to provide heat conductivity and/or a heat sink for semiconductor substrate 30. In one embodiment, support substrate 32 is provided as a copper layer such that subsequent processing fabricates semiconductor substrate 30 into an ultra thin semiconductor power chip having a copper heat sink. In one embodiment, support substrate 32 is a ceramic substrate or a glass substrate or other suitable support substrate configured to enable handling of semiconductor substrate 30 through thinning processes.

In one embodiment, interface 34 includes a bonding material configured to attach semiconductor substrate 30 to support substrate 32. Suitable bonding materials include adhesives, pastes, conductive adhesives/pastes, solder, metallized backsides that are heated to form a bond, or other materials that create an attachment interface for substrates 30, 32. In one embodiment, interface 34 is provided as an electrically conductive metallized backside configured for solder attachment of semiconductor layer 30 to support substrate 32.

In one embodiment, interface 34 is a bonding layer 34 that is electrically conducting and deposited in a suitable deposition process such as evaporation deposition, pressure deposition, sputtering, laminating or other suitable processes to enable bonding between support substrate 32 and semiconductor substrate 30. Suitable interface materials include gold, tin, silver, copper, alloys of gold and tin, alloys of tin and silver, alloys of tin and lead, alloys of copper and tin, or other suitable metals or metal alloys.

FIG. 2B is a schematic cross-sectional view of semiconductor substrate 30 thinned to provide a thinned semiconductor layer 36 (TSL 36). In one embodiment, semiconductor substrate 30 is thinned in a planarizing process such that TSL 36 has a thickness T of less than about seventy micrometers, preferably less than about fifty micrometers and preferably less than about twenty-five micrometers. In one embodiment, the thickness T of TSL 36 is between about 5-50 micrometers such that TSL 36 is an ultra thin layer.

In one embodiment, most of the semiconductor substrate 30 is removed by a suitable thinning process to leave a remaining portion of TSL 36. In one embodiment, between about 50-80% of the semiconductor substrate 30 is removed by a suitable thinning process to leave the illustrated remaining portion of TSL 36.

FIG. 2C is a schematic cross-sectional view of a through-connect 38 formed through TSL 36. In one embodiment, through-connect 38 is provided as a through-silicon via extending through the thickness T of TSL 36. In one embodiment, through-connect 38 electrically connects with electrically conducting layer 34. In one embodiment, through-connect 38 electrically communicates with support substrate 32, such that support substrate 32 is configured as an electrical contact-layer.

In one embodiment, through-connect 38 is drilled or bored through TSL 36 to form an opening that is subsequently filled with metal or a suitable electrically conducting material. In one embodiment, TSL 36 is provided as an ultra thin semiconductor layer and through-connect 38 is trench etched through TSL 36.

FIG. 3A-3F are schematic cross-sectional views of the formation of an ultra thin layered semiconductor chip attached to support substrate 32.

Figure 3A:
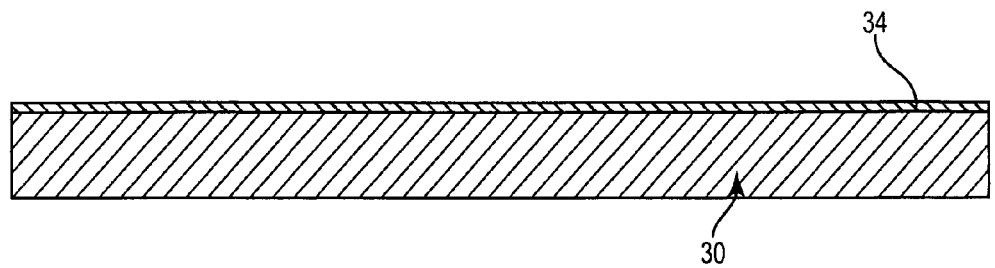
FIG. 3A is a schematic cross-sectional view of a semiconductor substrate including an electrically conductive backside.

FIG. 3A is a schematic cross-sectional view of semiconductor substrate 30 including a metallized backside 34. As noted above, metallized backside 34 suitably includes other attachment layers configured to attach semiconductor substrate 30 to support substrate 32.

Figure 3B:
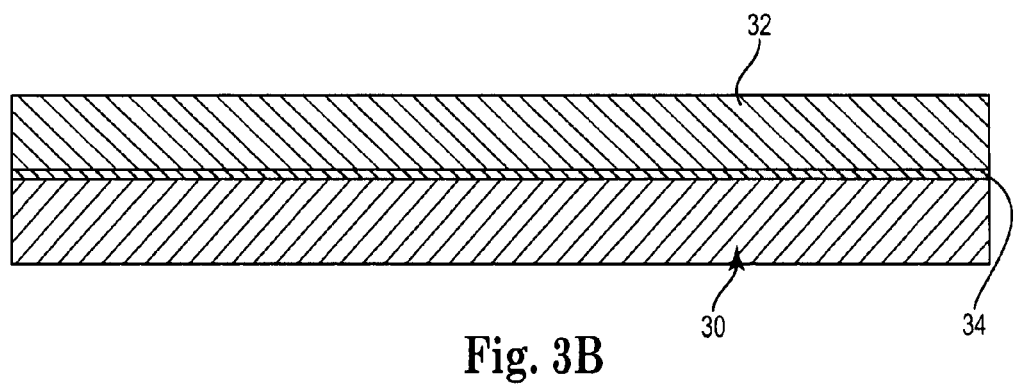
FIG. 3B is a schematic cross-sectional view of a support substrate attached to the semiconductor substrate illustrated in FIG. 3A.
Figure 3C:
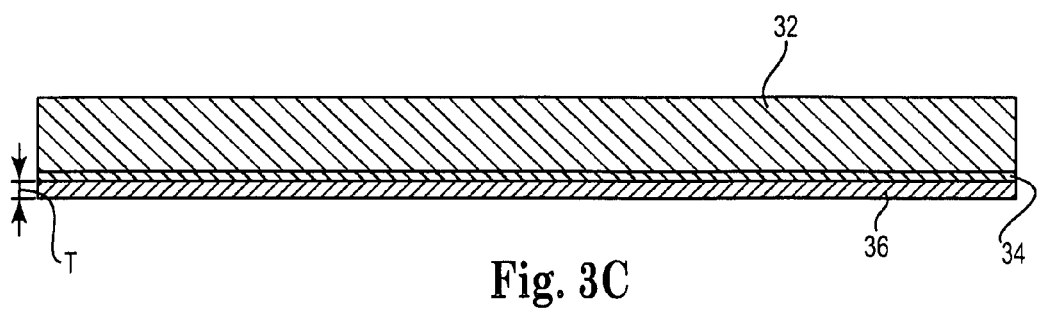
FIG. 3C is a schematic cross-sectional view of the semiconductor substrate illustrated in FIG. 3A thinned to provide a thinned semiconductor layer supported by the support substrate according to one embodiment.

FIG. 3B is a schematic cross-sectional view of support substrate 32 attached to semiconductor substrate 30 by metallized backside 34. It is desirable that support substrate 32 minimizes or eliminates bending or torsional forces directed to semiconductor substrate 30. In one embodiment, support substrate 32 is provided as a heat sink for TSL 36, and includes a coefficient of thermal expansion (CTE) that is selected to be approximately equal to (i.e., "match") a CTE of semiconductor substrate 30. In this manner, when the device is employed as a power semiconductor chip, support substrate 32 effectively dissipates heat generated by the power semiconductor chips and expands/moves in a similar or equal amount to TSL 36 due to the thermal heating.

Figure 3D:
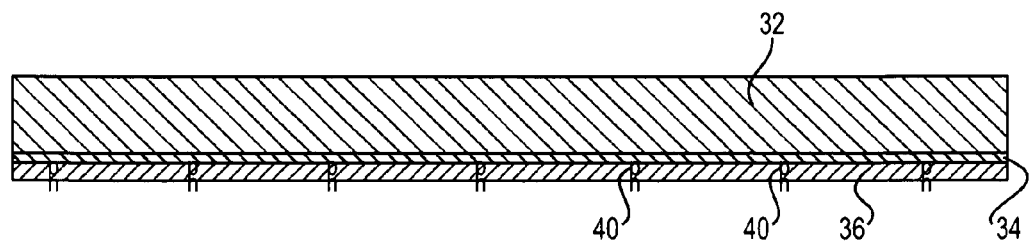
FIG. 3D is a schematic cross-sectional view of the thinned semiconductor layer illustrated in FIG. 3C including functional elements integrated with the thinned semiconductor layer according to one embodiment.

FIG. 3D is a schematic cross-sectional view of TSL 36 processed or further integrated to include components of functional elements 40. In one embodiment, TSL 36 is processed to include, for example, a diode pn-transition 40 distributed across TSL 36.

Figure 3E:
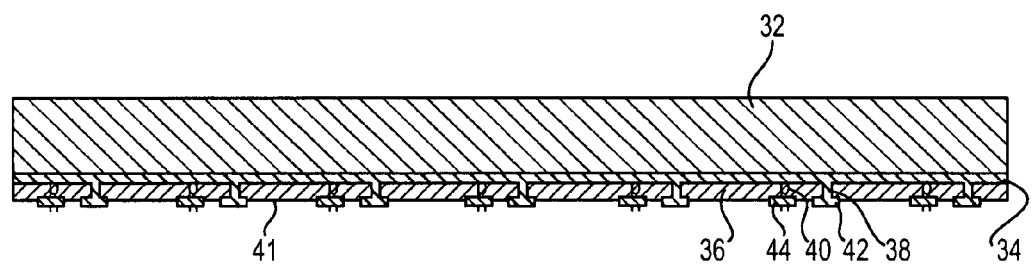
FIG. 3E is schematic cross-sectional view of the thinned semiconductor layer illustrated in FIG. 3D including through-connections formed through the thinned semiconductor layer according to one embodiment.

FIG. 3E is a schematic cross-sectional view of TSL 36 opened to include through-connections 38. In one embodiment, an external connection element 42 is connected with through-connection 38 and a separate external connection element 44 is connected to an external face of TSL 36 and connected to diode pn-transition 40. In one embodiment, external connection elements 42, 44 are deposited as an electrically conducting layer that is selectively open to define contact elements 42, 44. For example, in one embodiment an electrically conductive layer is deposited over face 41 of TSL 36 and selectively opened/removed by an etch process or photolithographic process to define connection elements 42, 44.

Figure 3F:
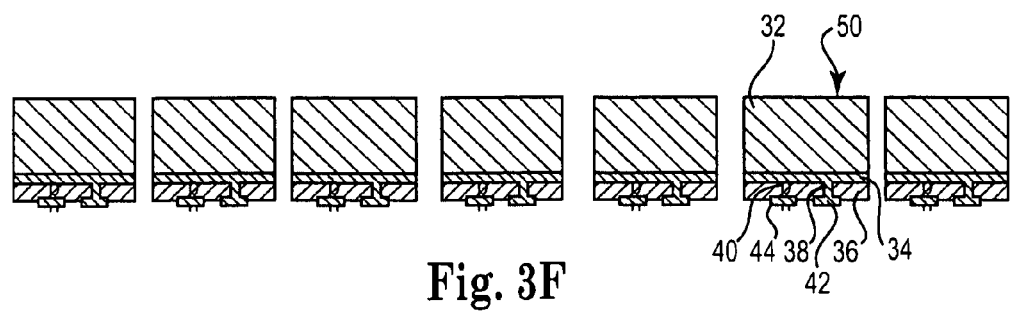
FIG. 3F is a schematic cross-sectional view of the components illustrated in FIG. 3E singulated to provide multiple semiconductor chips.

FIG. 3F is a schematic cross-sectional view of the substrates 32, 36 illustrated in FIG. 3E singulated to provide individual semiconductor chips 50 according to one embodiment. Semiconductor chip 50 includes ultra thin TSL 36 attached to support substrate 32 by an electrically conductive layer 34. In one embodiment, through-connection 38 is electrically connected with layer 34 and support substrate 32 and terminates in an external connection element 42. In one embodiment, external connection element 44 is connected to TSL 36 and electrically communicates with components of diode 40.

Embodiments of semiconductor chips fabricated to include an ultra thin TSL 36 that is attached to support substrate 32 by an electrically conductive layer 34 are suited for a wide range of electronic applications, some of which are detailed below.

Figure 4:
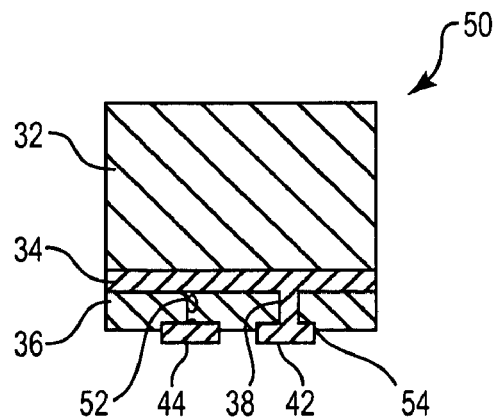
FIG. 4 is a schematic cross-sectional view of a power semiconductor transistor chip manufactured according to the process illustrated in FIG. 1 according to one embodiment.

FIG. 4 is a cross-sectional view of semiconductor chip 50 provided as a power chip having a metal heat sink 32. In one embodiment, TSL 36 is integrated to include a transistor having a drain/collector 52 on a face of TSL 36 oriented toward support substrate 32, and a source/emitter 54 on a face of TSL 36 opposite support substrate 32. In one embodiment, external connection element 42 is electrically connected with source/emitter 54 of the transistor and external connection element 44 is electrically connected with drain/collector 52 of the transistor. Thus, one embodiment of chip 50 includes a power transistor semiconductor chip having an ultra thin TSL 36 that is provided with excellent heat conduction through heat sink support substrate 32.

In one embodiment, TSL 36 is about one-tenth the thickness of support substrate 32, such that support substrate 32 is configured to quickly dissipate heat generated by semiconductor portions of TSL 36.

In one embodiment, chip 50 is further processed to include the attachment of rewiring suitable for thin film fabrication.

Figure 5:
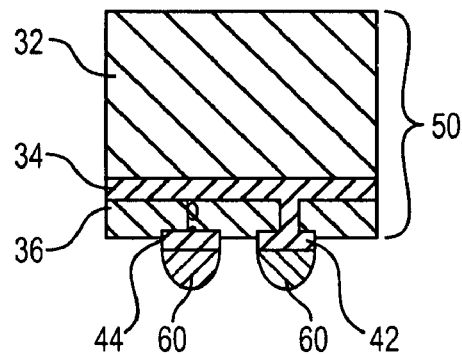
FIG. 5 is a schematic cross-sectional view of a semiconductor chip manufactured according to the process illustrated in FIG. 1 and including solder ball external elements according to one embodiment.

FIG. 5 is a schematic cross-sectional view of semiconductor chip 50 including solder balls 60. In one embodiment, one of the solder balls 60 is connected to external connection element 42 and another of the solder balls 60 is connected to external connection element 44. The solder balls 60 are configured to attach chip 50 to a circuit board or other electronic device.

Figure 6:
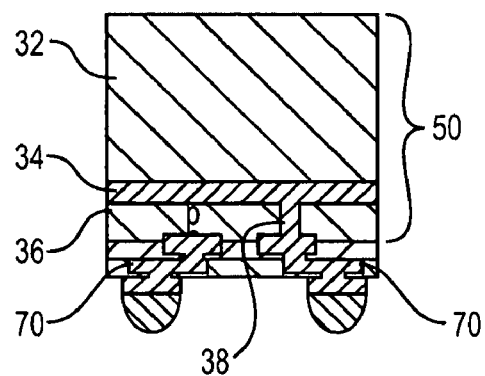
FIG. 6 is a schematic cross-sectional view of a semiconductor chip manufactured according to the process illustrated in FIG. 1 and including an electrical redistribution layer connected to a thinned semiconductor substrate according to one embodiment.

FIG. 6 is a schematic cross-sectional view of semiconductor chip 50 processed to include a redistribution layer 70 providing vertical current flow to support substrate 32. In one embodiment, redistribution layer 70 includes a layer of electrically conducting material deposited on a face of TSL 36 opposite support substrate 32. In one embodiment, the electrically conducting layer is selectively patterned, for example by a photolithographic process, to provide a structured redistribution layer 70. In one embodiment, a first portion of redistribution layer 70 is electrically connected with through-connect 38 and with a backside of TSL 36 through electrically conducting bonding material 34. In one embodiment, a portion of redistribution layer 70 is electrically connected with a face of TSL 36 that is opposite support substrate 32. In this manner vertical electrical connection is provided to semiconductor chip 50 through through-connect 38 for current flow in the Z-direction.

Figure 7:
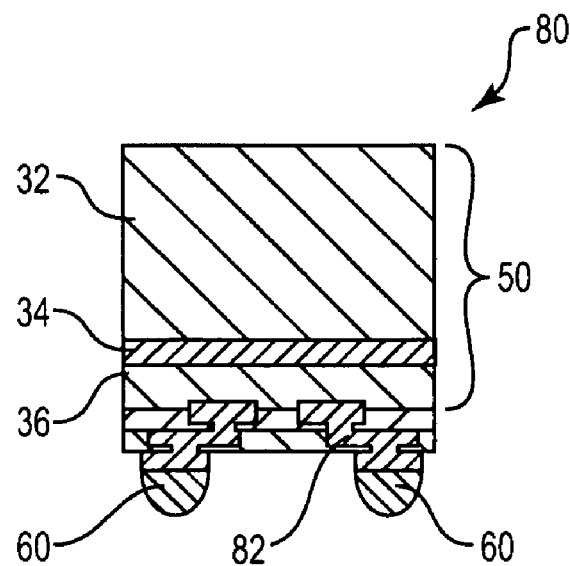
FIG. 7 is a schematic cross-sectional view of a semiconductor chip manufactured according to the process illustrated in FIG. 1 and including multiple input/outputs according to one embodiment.

FIG. 7 is a schematic cross-sectional view of a semiconductor device 80 manufactured according to the process illustrated in FIG. 1 and including multiple input/outputs according to one embodiment. Semiconductor device 80 is configured for lateral current flow and does provide vertical current flow in the Z-direction to support substrate 32. In one embodiment, one or more lateral distribution layers 82 are selectively patterned onto a face of TSL 36 to provide multiple inputs and outputs for chip 50. In this regard, it is to be understood that vertical current flow through chip 50 (FIG. 6) is optional such that some embodiments include lateral connection and no vertical through-connects.

In other embodiments, semiconductor chip 80 is fabricated to include a displacement-sensing movable membrane that is configured to sense pressure or acceleration.

Figure 8:
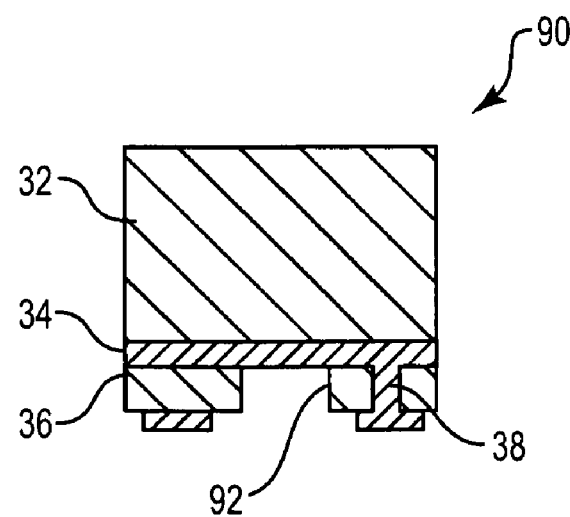
FIG. 8 is a schematic cross-sectional view of one embodiment of a light emitting diode fabricated according to the process illustrated in FIG. 1.

FIG. 8 is a schematic cross-sectional view of a semiconductor chip 90 fabricated by the process illustrated in FIG. 1 and configured as a light emitting diode 90 according to one embodiment. In one embodiment, interface 34 is configured as a metallized reflector formed of, for example, silver. Light emitting diode 90 includes support substrate 32 supporting TSL 36 as described above, where TSL 36 has been opened to provide a window 92 communicating with metallized reflector 34. In one embodiment, suitable connections are made to the backside of TSL 36 communicating with metallized reflector 34 including at least one through-connection 38 formed through TSL 36.

Embodiments of the semiconductor chips and devices described above include an ultra thin semiconductor layer fabricated in a manner that is suited for commercial production. Embodiments of the process described above for handling ultra thin semiconductor layers enables the handling of discs as thin as 5 micrometers in a highly efficient commercial production process. Embodiments describe the handling of mechanically fragile ultra thin substrates in commercially viable manner. These ultra thin silicon substrates include boron, InP, polycrystalline or semi-crystalline substrates.

In one embodiment, the ultra-thin semiconductor layer is coupled to a relatively thick (at least one order of magnitude thicker) heat sink configured for excellent heat dissipation of the semiconductor layer.

In one embodiment, optical applications are realized by fabricating a light emitting diode into the thin semiconductor layer. Where the thin semiconductor layer is coupled to the support layer by a suitable metallized reflector, for example silver, chips described above are fabricated to include excellent luminous efficiency.

In one embodiment, individual components across TSL 36 are suited for selective isolation to provide selective fabrication of multiple chips having multiple functionalities. In one embodiment, process flexibility is provided by the selective attachment of external connection elements 42, 44 to chip 50 or the devices described above.

The above-described thinned semiconductor layer is prepared/processed to provide suitable semiconductor chips including integrated circuits configured as logic circuits, control circuits, microprocessors, or microelectrical-mechanical components, or power semiconductor chips such as power transistors, power diodes, insulated gate bi-polar transistors, or other such power devices. Other suitable chips include vertical structure chips configured such that electric current flows in the Z-direction perpendicular to the supporting substrate. For example, in one embodiment the thinned semiconductor layer is fabricated to include a transistor having a first electrode on a first main face and a second electrode on a second main face opposite the first main face, as described above.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of manufacturing semiconductor devices including an ultra thin semiconductor layer that is supported by a substrate as discussed herein. Therefore, it is intended that this invention be limited only by the claims and the equivalents thereof.

What is claimed is:

1. A method of manufacturing a semiconductor device, comprising:
    permanently attaching a back side of a first semiconductor substrate to a support substrate;
    thinning the first semiconductor substrate from a front side, which is opposed the back side, to form a thinned semiconductor layer after the first semiconductor substrate has been permanently attached to the support substrate;
    forming a functional element in its entirety within the thinned semiconductor layer via the front surface, wherein the support substrate remains permanently attached to the thinned semiconductor layer including during the forming of the functional chip; and
    forming at least one through-connect through the thinned semiconductor layer.

2. The method of claim 1, comprising attaching the first semiconductor substrate to the support substrate with an electrically conductive bond material.

3. The method of claim 1, further comprising:
    dicing through the thinned semiconductor layer and the support substrate to singulate multiple semiconductor chips.

4. The method of claim 1, wherein the at least one through-connect is electrically connected with the support substrate.

5. The method of claim 1, wherein the support substrate comprises a thickness configured to support the first semiconductor substrate as the first semiconductor substrate is planarized/thinned, the thinned semiconductor layer about one-tenth the thickness of the support substrate.

6. The method of claim 1, further comprising:
    applying an electrically conducting layer to a surface of the thinned semiconductor layer that is opposite the support substrate.

7. The method of claim 1, further comprising:
    applying external connection elements to a surface of the thinned semiconductor layer that is opposite the support substrate.

8. The method of claim 7, wherein at least one of the external connection elements is electrically connected with one of the at least one through-connects.

9. The method of claim 8, comprising one external connection element electrically connected with one of the through-connects and with electrically conducting material disposed between the thinned semiconductor layer and the support substrate.

10. The method of claim 1, wherein the support substrate comprises a coefficient of thermal expansion (CTE) that is substantially the same as a CTE of the thinned semiconductor layer.

11. A method of manufacturing a semiconductor device, comprising:
    permanently attaching a back side of a first semiconductor substrate to a support substrate;
    thinning the first semiconductor substrate from a front side, which is opposed the back side, to form a thinned semiconductor layer after the first semiconductor substrate has been permanently attached to the support substrate;
    forming at least one functional circuit element in its entirety within the thinned semiconductor layer via the front surface, wherein the support substrate remains permanently attached to the thinned semiconductor layer including during formation of the functional circuit element; and forming at least one through-connect through the thinned semiconductor layer, wherein the functional element comprises one of a light emitting diode, a transistor, a vertical transistor, a pressure sensor, an acceleration sensor, and a displacement-sensing movable membrane.

12. A method of manufacturing a semiconductor device, comprising:
    permanently attaching a back side of a first semiconductor substrate to a support substrate;
    thinning the first semiconductor substrate from a front side, which is opposed the back side, to form a thinned semiconductor layer after the first semiconductor substrate has been permanently attached to the support substrate;
    forming at least one functional circuit element in its entirety within the thinned semiconductor layer via the front surface, wherein the support substrate remains permanently attached to the thinned semiconductor layer including during the forming of the functional circuit element; and
    forming at least one through-connect through the thinned semiconductor layer; and
    applying external connection elements to the surface of the thinned semiconductor layer that is opposite the support substrate; wherein the at least one functional circuit element comprises a transistor having:
        a drain/collector on a first face, the first face oriented toward the support substrate; and
        a source/emitter on a second face that is opposite the first face of the thinned semiconductor layer.

13. The method of claim 12, wherein at least one of the external connection elements is electrically connected with the drain/collector of the transistor and at least one of the external connection elements is electrically connected with the source/emitter of the transistor.

14. The method of claim 12, wherein the transistor comprises a power transistor.

15. The method of claim 14, wherein the support substrate comprises one of a metal heat sink, an inorganic layer, a glass layer, and a silicon semiconductor substrate connected to the thinned semiconductor layer with an electrically and thermally conducting material.

16. A method of manufacturing a semiconductor device, comprising:
    permanently attaching a back side of a first semiconductor substrate to a support substrate;
    thinning the first semiconductor substrate from a front side, which is opposed the back side, to form a thinned semiconductor layer after the first semiconductor substrate has been permanently attached to the support substrate;
    forming at least one functional circuit element in its entirety within the thinned semiconductor layer via the front surface, wherein the support substrate remains attached to the thinned semiconductor layer; and
    forming at least one through-connect through the thinned semiconductor layer, wherein the functional element comprises a light emitting diode, and the first semiconductor substrate is attached to the support substrate with a metallization layer that comprises a reflector for the light emitting diode.

17. A method of fabricating a semiconductor device, the method comprising:
    permanently attaching a semiconductor layer to a heat sink substrate with an electrically conductive material;
    thinning the semiconductor layer to a thickness of less than 80 micrometers after the semiconductor layer has been permanently attached to the heat sink substrate;
    forming at least one functional circuit element within the thinned semiconductor layer, wherein the heat sink substrate remains attached to the semiconductor layer; and
    attaching at least one connection element to the at least one functional circuit element, wherein the at least one functional circuit element comprises a power transistor comprising a drain/collector on a first face of the semiconductor layer oriented toward the heat sink substrate, and a source/emitter on an opposing second face of the semiconductor layer; and the at least one connection element comprises a first connection element connected to the drain/collector and a second connection element connected to the source/emitter.

18. The method of claim 17, wherein the at least one connection element comprises a contact pad connected to the semiconductor layer and communicating with a through-connect extending through the semiconductor layer to the electrically conductive material.

19. A method of fabricating a semiconductor device, the method comprising:
    permanently attaching a semiconductor layer to a heat sink substrate with an electrically conductive material;
    thinning the semiconductor layer to a thickness of less than 80 micrometers after the semiconductor layer has been permanently attached to the heat sink substrate;
    forming at least one functional circuit element within the thinned semiconductor layer, wherein the heat sink substrate remains attached to the semiconductor layer; and
    attaching at least one connection element to the at least one functional circuit element, wherein the at least one functional circuit element comprises a light emitting diode, and the electrically conductive material comprises a reflector for the light emitting diode.

20. A method of fabricating a light emitting semiconductor device, comprising:
    providing a support substrate;
    permanently attaching a semiconductor substrate to the support substrate with bond material that is configured as a reflector;
    removing a portion of a thickness of the semiconductor substrate so as to leave a remaining thinned semiconductor layer after the semiconductor substrate has been permanently attached to the support substrate;
    forming a functional circuit element in its entirety within the thinned semiconductor layer by processing the thinned semiconductor layer via a side of the thinned semiconductor layer opposite the support substrate, wherein the support substrate remains attached to thinned semiconductor layer; and
    forming connections to the thinned semiconductor layer.

21. The method of claim 20, comprising forming at least one through-connect through the thinned semiconductor layer.

22. The method of claim 20, comprising removing between about 50-80% of the semiconductor substrate.

23. A method of fabricating a power transistor semiconductor device, comprising:
    providing a heat sink substrate;
    permanently attaching a back side of a semiconductor substrate to the heat sink substrate;
    thinning the semiconductor substrate from a front side of the semiconductor substrate and so as to leave a remaining thinned semiconductor layer after the semiconductor substrate has been permanently attached to the heat sink substrate;

forming a drain/collector at a first face of the thinned semiconductor layer oriented toward the heat sink substrate and a source/emitter at an opposing second face of the thinned semiconductor layer via the second face of the thinned semiconductor layer, wherein the heat sink substrate remains attached to the thinned semiconductor layer; and connecting a first connection element to the drain/collector and connecting a second connection element to the source/emitter.

24. The method of claim 23, comprising attaching the semiconductor substrate to the heat sink substrate with an electrically conducting layer, and forming at least one through-connect through the thinned semiconductor layer that communicates with the electrically conducting layer.

* * * * *